United States Patent
Wang et al.

(10) Patent No.: US 9,225,189 B2
(45) Date of Patent: Dec. 29, 2015

(54) FLYBACK QUICK START DRIVING CIRCUIT AND DRIVING METHOD

(71) Applicant: SHENZHEN CHINA STAR OPTOELECTRONICS TECHNOLOGY CO., LTD., Shenzhen, Guangdong (CN)

(72) Inventors: Zhao Wang, Shenzhen (CN); Dan Cao, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 0 days.

(21) Appl. No.: 14/240,367

(22) PCT Filed: Jan. 22, 2014

(86) PCT No.: PCT/CN2014/071049
§ 371 (c)(1),
(2) Date: Feb. 22, 2014

(87) PCT Pub. No.: WO2015/081630
PCT Pub. Date: Jun. 11, 2015

(65) Prior Publication Data
US 2015/0162773 A1    Jun. 11, 2015

(30) Foreign Application Priority Data
Dec. 6, 2013  (CN) .......................... 2013 1 0655787

(51) Int. Cl.
*H02M 3/335*  (2006.01)
*H02J 7/00*  (2006.01)
*H01C 1/16*  (2006.01)
(Continued)

(52) U.S. Cl.
CPC ............. *H02J 7/0063* (2013.01); *G02F 1/1336* (2013.01); *H01C 1/16* (2013.01);
(Continued)

(58) Field of Classification Search
CPC . H02M 3/33523; H02M 3/3385; H02M 1/36; H02M 2001/0006
USPC .......................... 363/21.16, 15, 100; 327/483
See application file for complete search history.

(56) References Cited

U.S. PATENT DOCUMENTS 5,793,621 A * 8/1998 Yamada ................. G09G 1/005
315/411
5,909,363 A * 6/1999 Yoon ................. H02M 3/33507
363/21.16

FOREIGN PATENT DOCUMENTS

CN        102130596 A      7/2011

OTHER PUBLICATIONS

International Search Report dated Sep. 1, 2014, issued to International Application No. PCT/CN2014/071049.

*Primary Examiner* — Adolf Berhane
*Assistant Examiner* — Afework Demisse
(74) *Attorney, Agent, or Firm* — Stein IP, LLC

(57) ABSTRACT

The present disclosure discloses a flyback quick start driving circuit, comprising: a voltage input unit, a transformer including a primary winding, a secondary winding, and an auxiliary winding, a driving unit for controlling the primary winding of the transformer, a voltage pull-up unit, and a feedback control unit. The voltage pull-up unit performs a charging process according to the direct-current from the voltage input unit, so as to enable the output voltage rise up to a starting voltage which is input the driving unit. The driving unit output a control signal to drive the primary winding. Thus, a voltage is created across the auxiliary winding. The feedback control unit gets the voltage of the auxiliary winding, and determines whether to stop the charging of the voltage pull-up unit or not according to the voltage of the auxiliary winding. The circuit can be started quickly and have lower loss of the power.

20 Claims, 3 Drawing Sheets

(51) Int. Cl.
*H01L 25/00* (2006.01)
*G02F 1/1335* (2006.01)
*H02M 1/36* (2007.01)
*H02M 1/00* (2007.01)

(52) U.S. Cl.
CPC .............. *H01L 25/00* (2013.01); *H02J 7/0052* (2013.01); *H02M 1/36* (2013.01); *H02M 3/335* (2013.01); *H01L 2924/0002* (2013.01); *H02M 2001/0006* (2013.01)

FLYBACK QUICK START DRIVING CIRCUIT AND DRIVING METHOD

FIELD OF THE INVENTION

The present disclosure relates to a load start driving technology, and particularly, relates to a flyback quick start driving circuit and a driving method.

BACKGROUND OF THE INVENTION

A driving circuit for driving a high-power load (such as an LED tube serving as back lights of a liquid crystal display device) needs to meet the requirements of high power factor, constant output current, electric isolation, quick start, low power consumption and the like. At present, a flyback quick start driving circuit is widely used for the driving operation of the above-mentioned high-power load due to the advantages of its simplicity, good voltage regulation performance, stronger load capacity, and more resistant to interference. FIG. 1 shows a structural schematic diagram of a flyback quick start driving circuit in the prior art, wherein the input of the driving circuit is input of a full-bridge rectifier filter circuit 10, the output of the full-bridge rectified filter circuit 10 is electrically connected to the first end of a primary winding 21 of a transformer 20, the second end of the primary winding 21 of the transformer 20 is electrically connected to the first end of a switching transistor T11, the second end of the switching transistor T11 is electrically grounded through a divider resistor R11, and the control end of the switching transistor T11 is electrically connected with a driving chip 30, for receiving driving signals from the driving chip 30. Two series pull-up resistors R12 and R13 are electrically connected between the output of the full-bridge rectified filter circuit 10 and a first electrode of a capacitor C11, wherein a second electrode of the capacitor C11 is electrically grounded, and the first electrode of the capacitor C11 is electrically connected to the power port of the driving chip 30. The first end of an auxiliary winding 22 of the transformer 20 is electrically grounded, the second end of the auxiliary winding 22 is adjacent to the second end of the primary winding 21 and serves as its dotted terminal, meanwhile, a detection resistor R14 is electrically connected to the anode of a diode D11, and the cathode of the diode D11 is in turn electrically connected to the power port of the driving chip 30. Moreover, the first end of a secondary winding 23 of the transformer 20 is electrically connected to the anode of a diode D12, and two electrodes of a filter capacitor C12 are electrically connected to the cathode of the diode D12 and the second end of the secondary winding 23 of the transformer 20 respectively. At a starting stage of the above-mentioned driving circuit, an alternating-current voltage is converted to a direct-current voltage by a full-bridge rectified module 101, so as to charge the capacitor C11 through the two pull-up resistors R12 and R13. After the voltage on the first electrode of the capacitor C11 rises up to a starting voltage Vcc required during the operation of the driving chip 30, the circuit works normally and thus stays at a stable stage. On the condition that the two pull-up resistors R12 and R13 have high values of resistance, such as a megohm-level value, the charging of the capacitor C11 is relatively slow, which results in that the starting of the circuit is time consuming. On the condition that the two pull-up resistors R12 and R13 have low-values of resistance, such as a kiloohm-level value, the starting of the circuit can be speeded up, but the costs it brings is high standby power consumption of the circuit. Accordingly, it is difficult to balance the effects between the starting time and the standby power consumption of the flyback quick start driving circuit in the prior art.

SUMMARY OF THE INVENTION

Aiming at the above-mentioned problems, the present disclosure provides a flyback quick start driving circuit and a driving method. Starting of the driving circuit operating in the driving method can be speeded up, and in the meantime, its power loss is reduced.

The present disclosure provides a flyback quick start driving circuit, comprising:

a voltage input unit, for providing a direct-current voltage;

a transformer, including a primary winding and a secondary winding which are coupled on the different sides of the transformer, and an auxiliary winding coupled with the primary winding on the same side of the transformer, wherein the first end of the primary winding is electrically connected with the voltage input unit to receive the direct-current voltage;

a voltage pull-up unit, with the input thereof being electrically connected with the voltage input unit to receive the direct-current voltage which is used to performing the charging process, so as to enable the output voltage rise up to a starting voltage;

a driving unit, with the power port thereof being electrically connected with the voltage pull-up unit to receive the output voltage and the output thereof being electrically connected with the second end of the primary winding of the transformer, wherein, when the voltage on the power port rises up to the starting voltage, the unit starts and drives the primary winding of the transformer;

a feedback control unit, wherein the input thereof is electrically connected with the auxiliary winding of the transformer to get the voltage of the auxiliary winding, and the output thereof is electrically connected to the control end of the voltage pull-up unit to output a control signal according to the voltage of the auxiliary winding, so as to control the voltage pull-up unit to charge or not; and, when the voltage pull-up unit doesn't charge, the feedback control unit also supplies the voltage of the auxiliary winding to the driving unit to make it keep working.

According to an embodiment of the present disclosure, the voltage pull-up unit includes a divider resistor and two series pull-up resistors, wherein, the first end of the divider resistor and the first end of one pull-up resistor acts as the input of the voltage pull-up unit and are connected with the voltage input unit, the second end of the divider resistor and the second end of the other pull-up resistor are electrically connected to the first end and the control end of a switching transistor respectively, while the control end of the switching transistor acts as the control end of the voltage pull-up unit and is electrically connected to the output of the feedback control unit, the second end of the switching transistor is electrically connected to the anode of a diode, the cathode of the diode is electrically connected to the first electrode of a capacitor, the second electrode of the capacitor is electrically grounded, meanwhile, the first electrode of the capacitor also acts as the output of the voltage pull-up unit and is electrically connected to the power port of the driving unit.

According to an embodiment of the present disclosure, the driving unit includes a driving chip, wherein, the power port of the driving chip acts as the power port of the driving unit and is electrically connected to the output of the voltage pull-up unit, the control signal output end of the driving chip is electrically connected to the control end of a switching transistor. The first end of the switching transistor acts as the output of the driving unit and is electrically connected to the second end of the primary winding of the transformer, and the second end of the switching transistor is electrically grounded through a divider resistor.

According to an embodiment of the present disclosure, the feedback control unit includes a detection resistor, with the first end acting as the input end of the feedback control unit and being electrically connected with the auxiliary winding of the transformer, with the second end being electrically connected with the anode of a diode. The cathode of the diode is electrically grounded through two series divider resistors. The voltage across one of the two divider resistors is fed back to one input of a comparator, while a preset reference voltage is applied to the other input of the comparator. The output of the comparator is electrically connected to the control end of a switching transistor, wherein, the first end of the switching transistor is electrically grounded, and the second end of the switching transistor acts as the output of the feedback control unit and is electrically connected to the control end of the voltage pull-up unit. Moreover, the cathode of the diode is also electrically connected to the power port of the driving unit.

According to an embodiment of the present disclosure, the voltage input unit includes a full-bridge rectified filter circuit.

According to an embodiment of the present disclosure, the above-mentioned circuit may further include:

a voltage output unit, arranged between the secondary winding of the transformer and a load, for voltage stabilizing and isolation.

According to an embodiment of the present disclosure, in the above-mentioned transformer, the first end of the auxiliary winding is electrically grounded, the second end of the auxiliary winding is adjacent to the second end of the primary winding and serves as its dotted terminal, meanwhile, the second end of the auxiliary winding is also electrically connected to the input of the feedback control unit.

According to an embodiment of the present disclosure, in the above-mentioned voltage pull-up unit, the divider resistor has a kiloohm-level value, and the two pull-up resistors have megohm-level value.

Moreover, the present disclosure also provides a driving method for the flyback quick start driving circuit, including:

pulling up the voltage of the power port of a driving unit to a starting voltage by charging, to drive the driving unit to work;

driving a primary winding of a transformer to work by the driving unit, and thus generating an auxiliary winding voltage across an auxiliary winding of the transformer; and detecting the auxiliary winding voltage, and determining whether to stop charging or not according to the magnitude of the auxiliary winding voltage, if the charging is stopped, then the driving unit is kept working by the auxiliary winding voltage.

Further, if the auxiliary winding voltage is greater than a preset reference voltage, the charging is stopped.

Compared with the prior art, the flyback quick start driving circuit provided in the present disclosure has the advantages of quick start and low power consumption. At the starting stage of the circuit, the voltage required during starting is quickly pulled up to the starting voltage by charging. At the stabilizing stage of the circuit, the voltage of the auxiliary winding of the transformer is monitored. The driving unit keeps working even if the charging process is stopped, so that the circuit enters a standby state with low power consumption. The present disclosure is particularly suitable for driving a high-power load which needs quickly start, such as backlights of a liquid crystal display (LCD) panel.

BRIEF DESCRIPTION OF THE DRAWINGS

The accompanying drawings are provided for further understanding of the present disclosure, and as a part of the description, are used for illustrating the present disclosure together with the embodiments of the present disclosure, rather than limiting the present disclosure, in which.

DETAILED DESCRIPTION OF THE EMBODIMENTS

Figure 1:
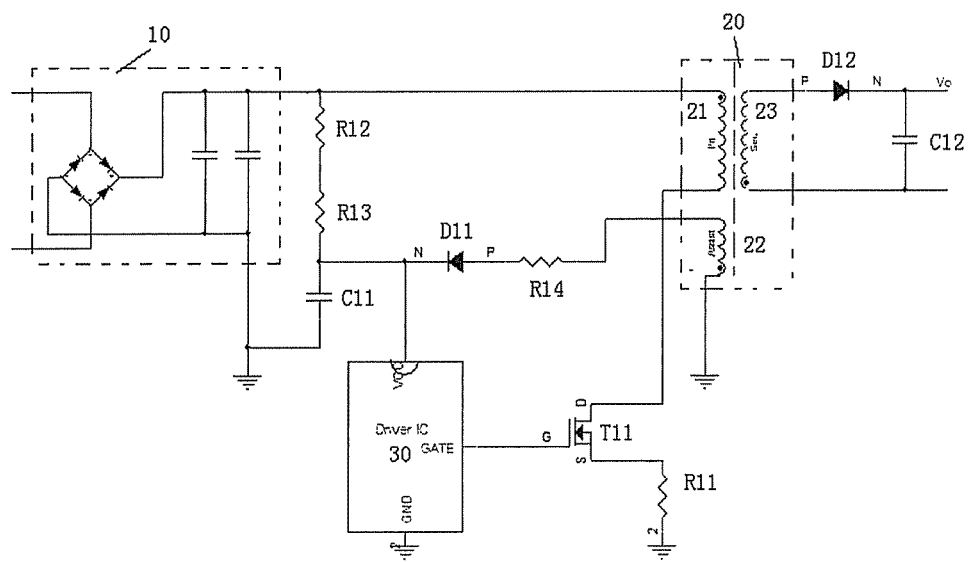
FIG. 1 is a schematic diagram of a flyback quick start driving circuit in the prior art.
Figure 2:
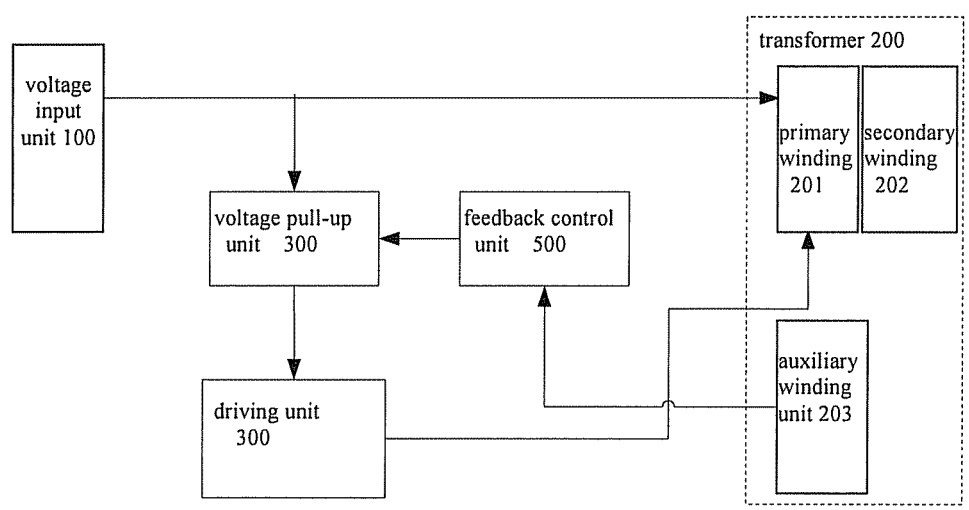
FIG. 2 is a block diagram of a flyback quick start driving circuit according to the present disclosure.

FIG. 2 shows a block diagram of a flyback quick start driving circuit according to the present disclosure. The circuit includes a voltage input unit 100, a transformer 200, a voltage pull-up unit 300, a driving unit 400, and a feedback control unit 500, wherein, the voltage input unit 100 provides a direct-current voltage.

The transformer 200 includes a primary winding 201 and a secondary winding 202 coupled on the different sides of the transformer, and an auxiliary winding 203 coupled with the primary winding 201 on the same side of the transformer, wherein the first end of the primary winding 201 is electrically connected with the voltage input unit 100 to receive the direct-current voltage.

The input of the voltage pull-up unit 300 is electrically connected with the voltage input unit 100 to receive the direct-current voltage, and the output is electrically connected with the power port of the driving unit 400 to perform a charging process based on the direct-current voltage, so as to quickly pull up the voltage supplied to the power port of the driving unit 400 to a starting voltage Vcc.

The output of the driving unit 400 is electrically connected to the second end of the primary winding 201 of the transformer 200, and after the voltage across the power port rises up to the starting voltage Vcc, the driving unit 400 starts working and outputs a driving signal to correspondingly drive the primary winding 201 of the transformer 200.

The input of the feedback control unit 500 is electrically connected with the auxiliary winding 203 of the transformer 200 to detect the voltage of the auxiliary winding, and its output is electrically connected to the control end of the voltage pull-up unit 300, to determine whether to output a control signal or not according to the magnitude of the voltage of the auxiliary winding. The control signal is used to control the voltage pull-up unit 300 to charge or not. When the voltage pull-up unit 300 stops the process of charging, the feedback control unit 500 also feed the voltage of the auxiliary winding back to the driving unit 400 to enable it keep working.

Certainly, according to practical situation, the above-mentioned flyback quick start driving circuit may further include other functional modules, such as a voltage output module 600, placed between the secondary winding 202 of the transformer 200 and a load, for purpose of voltage stabilizing and isolation.

A driving method for the flyback quick start driving circuit includes the following steps of:

pulling up the voltage of the power port of a driving unit is pulled up to a starting voltage by charging, to drive the driving unit to work;

driving a primary winding of a transformer to work by the driving unit, and thus generating an auxiliary winding voltage across an auxiliary winding of the transformer; and detecting the auxiliary winding voltage, and determining whether to stop charging or not according to the magnitude of the auxiliary winding voltage, if the charging is stopped, then the driving unit is kept working by the auxiliary winding voltage.

To make the objectives, technical solutions, and advantages of the present disclosure clearer, the present disclosure will be further illustrated in detail below in conjunction with the specific embodiments.

Figure 3:
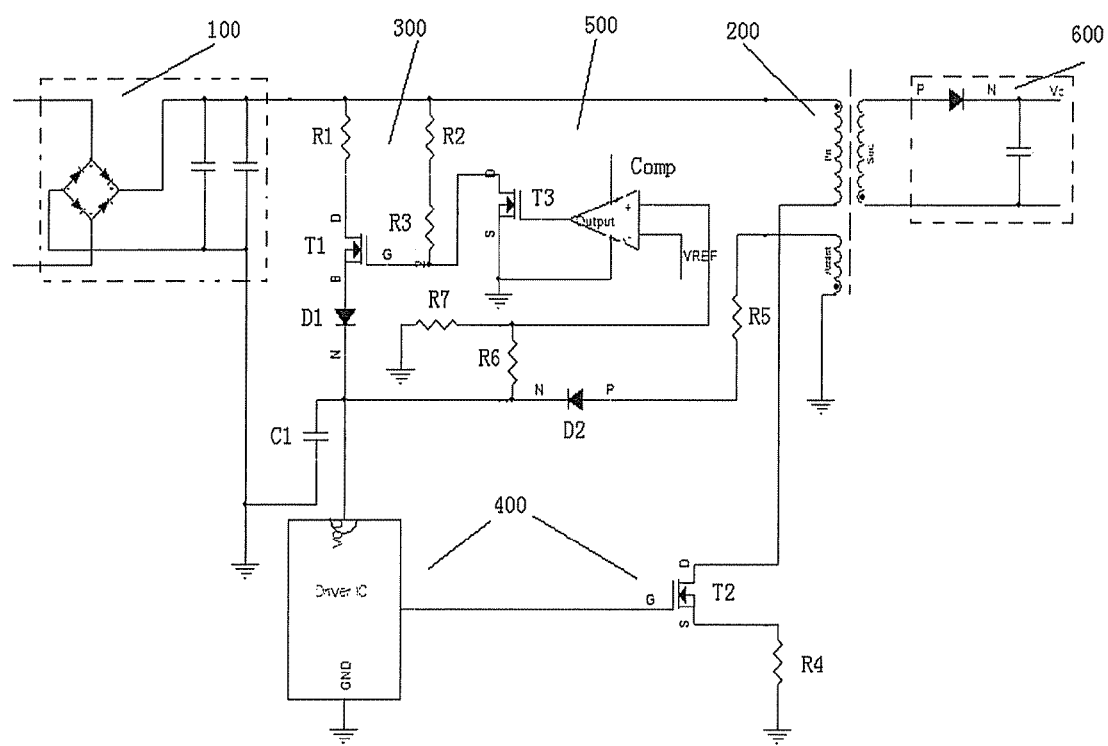
FIG. 3 is a schematic diagram of a specific embodiment of the flyback quick start driving circuit shown in FIG. 2.

As shown in FIG. 3, which is a schematic diagram of a specific embodiment of the above-mentioned flyback quick start driving circuit, the circuit is used for driving LED back lights of a liquid crystal display panel, wherein, the voltage input unit 100 comprises a full-bridge rectifier filter circuit 101 which converts the received alternating-current voltage into a constant direct-current voltage and then outputs the voltage.

The first end of the primary winding 201 of the transformer 200 is electrically connected with the voltage input unit 100 to receive the direct-current voltage. The first end of the auxiliary winding 203 of the transformer 200 is electrically grounded, and the second end thereof is adjacent to the second end of the primary winding 201 and serves as its dotted terminal.

The voltage pull-up unit 300 includes a divider resistor R1 and two series pull-up resistors R2 and R3, wherein, the first end of the divider resistor R1 and the first end of the pull-up resistor R2 act as the input of the voltage pull-up unit 300 and are connected to the output of the voltage input unit 100 to receive the direct-current voltage. The second end of the divider resistor R1 and the second end of the pull-up resistor R3 are electrically connected to the first end and the control end of a switching transistor T1 respectively. The control end of the switching transistor T1 also acts as the control end of the voltage pull-up unit 300, and the second end of the switching transistor T1 is electrically connected to the anode of a diode D1. The cathode of the diode D1 is electrically connected to the first electrode of a capacitor C1. The second electrode of the capacitor C1 is electrically grounded, meanwhile, the first electrode thereof also acts as the output of the voltage pull-up unit 300 and electrically connected to the power port of the driving unit 400. In this embodiment, preferably, the pull-up resistors R2 and R3 are megohm-level resistors, and the divider resistor R1 has relatively small resistance such as a kiloohm-level resistance, so that the voltage on the first electrode of the capacitor C1 is quickly pulled up to the starting voltage Vcc.

The driving unit 400 includes a driving chip, indicated by Drive IC. In this embodiment, the driving chip Drive IC is a driving chip in a backlight module of the liquid crystal display panel. It is necessary for the chip to work under the starting voltage Vcc to output a corresponding control signal. The power port of the driving chip Drive IC acts as the power port of the driving unit 400 and is electrically connected to the output of the voltage pull-up unit 300. The control signal output of the driving chip Drive IC is electrically connected to the control end of a switching transistor T2. The first end of the transistor T2 acts as the output of the driving unit 400 and is electrically connected to the second end of the primary winding 201 of the transformer 200. The second end of the switching transistor T2 is electrically grounded through a divider resistor R4. On the control of the control signal from the driving chip Drive IC, the switching transistor T2 is turned on or off, so as to control the second end of the primary winding 201 of the transformer 200 to be connected to or disconnected from the ground.

The feedback control unit 500 includes a detection resistor R5. The first end of the detection resistor R5 acts as the input of the feedback control unit 500 and is electrically connected to the second end of the auxiliary winding 201 of the transformer 200 to detect the auxiliary winding voltage. The second end of the detection resistor R5 is electrically connected to the anode of a diode D2, and the cathode of the diode D2 is in turn electrically connected to the power port of the driving unit 400 (i.e. the power port of the driving chip Drive IC) and also electrically grounded through two series divider resistors R6 and R7. The divider resistors R6 and R7 are used for dividing the auxiliary winding voltage. The voltage across the two divider resistors R6 and R7 is fed back to one input of a comparator, indicated by Comp. The other input of the comparator Comp is given a preset reference voltage, and the output end of the comparator Comp is electrically connected to the control end of a switching transistor T3. The first end of the switching transistor T3 is electrically grounded, and the second end of the switching transistor T3 acts as the output of the feedback control unit 500 and electrically connected to the control end of the voltage pull-up unit 300 (i.e. the control end of the switching transistor T1 of the voltage pull-up unit 300). In this embodiment, when the feedback voltage is greater than the preset reference voltage, the control signal from the comparator Comp controls the switching transistor T3 to be turned on, so that the voltage of the control end of the switching transistor T1 of the voltage pull-up unit 300 is pulled down to zero level, and then the switching transistor T1 is turned off. In this case, the charging circuit for the capacitor C1 in the voltage pull-up unit 300 is open.

Specifically, the principle of the flyback quick start driving circuit shown in FIG. 3 is illustrated as follows.

At a circuit starting stage, the voltage pull-up unit 300 receives the direct-current voltage provided by the voltage input unit 100. The switching transistor T1 is turned on by means of the pull-up resistors R2 and R3, and then the charging circuit for the capacitor C1 is closed. Meanwhile, because of the relatively low resistance of the divider resistor R1, the charging current of the capacitor C1 is relatively great, and thus the voltage on the first electrode of the capacitor C1 quickly rises up to the starting voltage Vcc, so that the driving chip Drive IC can be quickly started.

When the voltage on the first electrode of the capacitor C1 rises up to the starting voltage Vcc, correspondingly the voltage across the power port of the driving chip Drive IC also rises up to the starting voltage Vcc. Thus, the driving chip Drive IC starts working and outputs a control signal to the switching transistor T2. The switching transistor T2 is turned on under the control of the control signal, so that there is formed a closed circuit through the voltage input unit 100, the primary winding 201 of the transformer 200, the divider resistor R4, and the ground. In this case, the primary winding 201 of the transformer 200 starts working and provides a primary winding voltage.

At a circuit stabilizing stage, the auxiliary winding 203 of the transformer 200 generates a corresponding auxiliary winding voltage in response to the primary winding voltage from the primary winding 201. The auxiliary winding voltage is divided through the divider resistors R6 and R7. The voltage across one divider resistor is then fed back to the comparator Com so as to be compared with the preset reference voltage. If the auxiliary winding voltage is greater than the reference voltage, then the comparator Com outputs the corresponding control signal to control the switching transistor T3 to be turned on, so that the voltage on the control end of the switching transistor T1 is pulled down to zero level. In this case, the switching transistor T1 is turned off, and thus the charging circuit for the capacitor C1 in the voltage pull-up unit 300 is open. Although the voltage pull-up unit 300 stops charging the capacitor C1, the auxiliary winding voltage is fed back to the power port of the driving chip Drive IC through the detection resistor R5 and the diode D2 by the feedback control unit 500, and thus the driving chip Drive IC can keep working under the auxiliary winding voltage, without affecting the operation of the circuit.

Certainly, if the auxiliary winding voltage goes down so that the corresponding feedback voltage is smaller than or equal to the reference voltage, then the comparator Comp outputs the corresponding control signal to control the switching transistor T3 to be turned off. In this case, the switching transistor T1 is turned on again, the voltage pull-up unit 300 restores the charging process for the capacitor C1, and the charging process at this moment is same as at the circuit starting stage.

As mentioned in the background of the invention, it is difficult to achieve a good compromise effect both on the starting time and the standby power consumption of the flyback quick start driving circuit in the prior art. In the present disclosure, the flyback quick start driving circuit have the advantages of quick start and low standby power consumption, therefore it is high in overall efficiency and makes a prominent progress.

It should be noted that the present disclosure may also be applied for driving other types of loads except an LED tube serving as backlights of a liquid crystal display device. Any parameters of components in the circuit may be selected and set according to the specific requirements of the loads.

Although the embodiments are described above, the foregoing are merely the embodiments for facilitating the understanding of the present disclosure, rather than limiting the present disclosure. Any changes or alternatives conceived by the skilled in the art after reading the content disclosed herein will be fallen in the scope of the present disclosure. Accordingly, the scope of the present disclosure will be defined in the accompany claims.

The invention claimed is:

1. A flyback quick start driving circuit, comprising:
   a voltage input unit, for providing a direct-current voltage;
   a transformer, including a primary winding and a secondary winding which are coupled on the different sides of the transformer, and an auxiliary winding coupled with the primary winding on the same side of the transformer, wherein the first end of the primary winding is electrically connected with the voltage input unit to receive the direct-current voltage;
   a voltage pull-up unit, with the input thereof being electrically connected with the voltage input unit to receive the direct-current voltage which is used to perform the charging process, so as to enable the output voltage rise up to a starting voltage;
   a driving unit, with the power port thereof being electrically connected with the voltage pull-up unit to receive the output voltage and the output thereof being electrically connected with the second end of the primary winding of the transformer, wherein, when the voltage on the power port rises up to the starting voltage, the unit starts and drives the primary winding of the transformer;
   a feedback control unit, wherein the input thereof is electrically connected with the auxiliary winding of the transformer to get the voltage of the auxiliary winding, and the output thereof is electrically connected to the control end of the voltage pull-up unit to output a control signal according to the voltage of the auxiliary winding, so as to control the voltage pull-up unit to charge or not; and, when the voltage pull-up unit doesn't charge, the feedback control unit also feed the voltage of the auxiliary winding to the driving unit to make it keep working.

2. The circuit as recited in claim 1, wherein, the voltage pull-up unit includes a divider resistor and two series pull-up resistors, wherein, the first end of the divider resistor and the first end of one pull-up resistor acts as the input of the voltage pull-up unit and are connected with the voltage input unit, the second end of the divider resistor and the second end of the other pull-up resistor are electrically connected to the first end and the control end of a switching transistor respectively, while the control end of the switching transistor acts as the control end of the voltage pull-up unit and is electrically connected to the output of the feedback control unit, the second end of the switching transistor is electrically connected to the anode of a diode, the cathode of the diode is electrically connected to the first electrode of a capacitor, the second electrode of the capacitor is electrically grounded, meanwhile, the first electrode of the capacitor also acts as the output of the voltage pull-up unit and is electrically connected to the power port of the driving unit.

3. The circuit as recited in claim 2, wherein,
   the driving unit includes a driving chip, wherein, the power port of the driving chip acts as the power port of the driving unit and is electrically connected to the output of the voltage pull-up unit, the control signal output end of the driving chip is electrically connected to the control end of a switching transistor, the first end of the switching transistor acts as the output of the driving unit and is electrically connected to the second end of the primary winding of the transformer, and the second end of the switching transistor is electrically grounded through a divider resistor.

4. The circuit as recited in claim 3, wherein,
   the feedback control unit includes a detection resistor, wherein, the first end acts as the input end of the feedback control unit and is electrically connected with the auxiliary winding of the transformer, the second end is electrically connected with the anode of a diode, the cathode of the diode is electrically grounded through two series divider resistors, the voltage across one of the two divider resistors is fed back to one input of a comparator, while a preset reference voltage is applied to the other input of the comparator; the output of the comparator is electrically connected to the control end of a switching transistor, the first end of which is electrically grounded, and the second end of which acts as the output of the feedback control unit and is electrically connected to the control end of the voltage pull-up unit, the cathode of the diode is also electrically connected to the power port of the driving unit.

5. The circuit as recited in claim 3, wherein, the voltage input unit includes a full-bridge rectified filter circuit.

6. The circuit as recited in claim 1, further comprising a voltage output unit, arranged between the secondary winding of the transformer and a load, for voltage stabilizing and isolation.

7. The circuit as recited in claim 1, wherein, the first end of the auxiliary winding is electrically grounded, and the second end of the auxiliary winding is adjacent to the second end of the primary winding and serves as its dotted terminal, meanwhile, the second end of the auxiliary winding is also electrically connected to the input of the feedback control unit.

8. The circuit as recited in claim 2, wherein, the first end of the auxiliary winding is electrically grounded, and the second end of the auxiliary winding is adjacent to the second end of the primary winding and serves as its dotted terminal, meanwhile, the second end of the auxiliary winding is also electrically connected to the input of the feedback control unit.

9. The circuit as recited in claim 3, wherein, the first end of the auxiliary winding is electrically grounded, and the second end of the auxiliary winding is adjacent to the second end of the primary winding and serves as its dotted terminal, meanwhile, the second end of the auxiliary winding is also electrically connected to the input of the feedback control unit.

10. The circuit as recited in claim 4, wherein, the first end of the auxiliary winding is electrically grounded, and the second end of the auxiliary winding is adjacent to the second end of the primary winding and serves as its dotted terminal, meanwhile, the second end of the auxiliary winding is also electrically connected to the input of the feedback control unit.

11. The circuit as recited in claim 2, wherein, the divider resistor is kiloohm-level, the two pull-up resistors are in megohm-level.

12. A driving method for a flyback quick start driving circuit,
the flyback quick start driving circuit comprising:
a voltage input unit, for providing a direct-current voltage;
a transformer, including a primary winding and a secondary winding which are coupled on the different sides of the transformer, and an auxiliary winding coupled with the primary winding on the same side of the transformer, wherein the first end of the primary winding is electrically connected with the voltage input unit to receive the direct-current voltage;
a voltage pull-up unit, with the input thereof being electrically connected with the voltage input unit to receive the direct-current voltage which is used to perform the charging process, so as to enable the output voltage rise up to a starting voltage;
a driving unit, with the power port thereof being electrically connected with the voltage pull-up unit to receive the output voltage and the output thereof being electrically connected with the second end of the primary winding of the transformer, wherein, when the voltage on the power port rises up to the starting voltage, the unit starts and drives the primary winding of the transformer; and
a feedback control unit, wherein the input thereof is electrically connected with the auxiliary winding of the transformer to get the voltage of the auxiliary winding, and the output thereof is electrically connected to the control end of the voltage pull-up unit to output a control signal according to the voltage of the auxiliary winding, so as to control the voltage pull-up unit to charge or not; and, when the voltage pull-up unit doesn't charge, the feedback control unit also supplies the voltage of the auxiliary winding to the driving unit to make it keep working,
wherein the driving method comprises the following steps of:
pulling up the voltage of the power port of a driving unit to a starting voltage by charging, to drive the driving unit to work;
driving a primary winding of a transformer to work by the driving unit, and thus generating an auxiliary winding voltage across an auxiliary winding of the transformer; and
detecting the auxiliary winding voltage, and determining whether to stop charging or not according to the magnitude of the auxiliary winding voltage, if the charging is stopped, then the driving unit is kept working under the auxiliary winding voltage.

13. The method as recited in claim 12, wherein, the voltage pull-up unit includes a divider resistor and two series pull-up resistors, wherein, the first end of the divider resistor and the first end of one pull-up resistor acts as the input of the voltage pull-up unit and are connected with the voltage input unit, and the second end of the divider resistor and the second end of the other pull-up resistor are electrically connected to the first end and the control end of a switching transistor respectively, while the control end of the switching transistor acts as the control end of the voltage pull-up unit and is electrically connected to the output of the feedback control unit, and the second end of the switching transistor is electrically connected to the anode of a diode, the cathode of the diode is electrically connected to the first electrode of a capacitor, the second electrode of the capacitor is electrically grounded, meanwhile, the first electrode of the capacitor also acts as the output of the voltage pull-up unit and is electrically connected to the power port of the driving unit.

14. The method as recited in claim 13, wherein,
the driving unit includes a driving chip, wherein, the power port of the driving chip acts as the power port of the driving unit and is electrically connected to the output of the voltage pull-up unit, the control signal output end of the driving chip is electrically connected to the control end of a switching transistor, the first end of the switching transistor acts as the output of the driving unit and is electrically connected to the second end of the primary winding of the transformer, and the second end of the switching transistor is electrically grounded through a divider resistor.

15. The method as recited in claim 14, wherein,
the feedback control unit includes a detection resistor, wherein, the first end acts as the input end of the feedback control unit and is electrically connected with the auxiliary winding of the transformer, the second end is electrically connected with the anode of a diode, the cathode of the diode is electrically grounded through two series divider resistors, the voltage across one of the two divider resistors is fed back to one input of a comparator, meanwhile a preset reference voltage is applied to the other input of the comparator; the output of the comparator is electrically connected to the control end of a switching transistor, the first end of which is electrically grounded, and the second end of which acts as the output of the feedback control unit and is electrically connected to the control end of the voltage pull-up unit, the cathode of the diode is also electrically connected to the power port of the driving unit.

16. The method as recited in claim 15, wherein, the voltage input unit includes a full-bridge rectified filter circuit.

17. The method as recited in claim 12, further comprising a voltage output unit, arranged between the secondary winding of the transformer and a load, for voltage stabilizing and isolation.

18. The method as recited in claim 12, wherein, the first end of the auxiliary winding is electrically grounded, the second end of the auxiliary winding is adjacent to the second end of the primary winding and serves as its dotted terminal, meanwhile, the second end of the auxiliary winding is also electrically connected to the input of the feedback control unit.

19. The method as recited in claim 13, wherein, the divider resistor has a kiloohm-level value, and the two pull-up resistors have megohm-level value.

20. The method as recited in claim 12, wherein, if the auxiliary winding's voltage is greater than a preset reference voltage, the charging is stopped.

\* \* \* \* \*